United States Patent [19]
Kanterakis et al.

[11] Patent Number: 6,008,918
[45] Date of Patent: *Dec. 28, 1999

[54] OPTICAL INTERCONNECT FOR HIGH SPEED PROCESSOR

[75] Inventors: Emmanuel Kanterakis, Highland Park, N.J.; Jian-Ming Wang, Port Washington, N.Y.

[73] Assignee: InterDigital Technology Corporation, Wilmington, Del.

[ * ] Notice: This patent is subject to a terminal disclaimer.

[21] Appl. No.: 08/896,367

[22] Filed: Jul. 18, 1997

Related U.S. Application Data

[63] Continuation of application No. 08/641,632, May 2, 1996, Pat. No. 5,677,778, which is a continuation of application No. 08/068,518, May 28, 1993, Pat. No. 5,515,194.

[51] Int. Cl.$^6$ .................................................. H04J 14/02
[52] U.S. Cl. ............................................ 359/117; 359/127
[58] Field of Search ..................................... 359/117, 127, 359/128, 129, 130, 131, 634; 385/24, 25, 36; 395/200

[56] References Cited

U.S. PATENT DOCUMENTS

| | | | |
|---|---|---|---|
| 4,222,115 | 9/1980 | Cooper et al. | 375/1 |
| 4,386,414 | 5/1983 | Case | 364/826 |
| 4,765,753 | 8/1988 | Schmidt | 379/60 |
| 4,779,235 | 10/1988 | Kubota | 365/324 |
| 4,986,640 | 1/1991 | Athale | 350/358 |
| 5,101,501 | 3/1992 | Gilhousen et al. | 455/33 |
| 5,128,959 | 7/1992 | Bruckert | 375/1 |
| 5,140,466 | 8/1992 | Parker | 359/633 |
| 5,153,757 | 10/1992 | Cloonan et al. | 359/117 |
| 5,164,913 | 11/1992 | Guilfoyle et al. | 364/713 |
| 5,291,324 | 3/1994 | Hinterlong | 359/135 |
| 5,488,735 | 1/1996 | Tanabe et al. | 395/800 |

OTHER PUBLICATIONS

Li et al., "Ring–Array Processor Distribution Topology for Optical Interconnects", Applied Optics, vol. 31, No. 26, (1992) pp. 5548–5558.

F.E. Kiamiley et al., "Performance Comparison Between Optoelectronic and VLSI Multistage Interconnection Networks", J. Lightwave Tech., vol. 9, No. 12 (Dec. 1991) pp. 1674–1692.

L.D. Hutcheson and P. Haugen, "Optical Interconnects Replace Hardwire", IEEE Spectrum (Mar. 1987), pp. 30–35.

J.W. Goodman, et al., "Optical Interconnections For VLSI Systems", Proc. IEEE, vol. 72, No. 7 (Jul. 1984), pp. 850–866.

L. Thylen, "Integrated Optics in LiNbO$_3$: Recent Developments in Devices for Telecommunications", IEEE, J. Lightwave Tech., vol. 6, No. 6 (Jun. 1988), pp. 847–861.

N. Kagelnik, "Coupled Wave Theory for Thick Hologram Gratings", Bell System Tech. Journal, vol. 48, No. 9 (Nov. 1969), pp. 2909–2947.

Primary Examiner—Rafael Bacares
Attorney, Agent, or Firm—Volpe and Koenig, P.C.

[57] ABSTRACT

An optical interconnect for use with SIMD processors, including holographic-optical elements, dove prisms, beamsplitters and a processor. Laser diodes, with each operating at a different wavelength, generate coherent-light beams at different wavelengths. A fiber combiner, an optical fiber and a fiber splitter are connected to divide output light from the laser diodes into equal path lengths. The output light is modulated by data from a respective SIMD processor. The output light forms an input ring at an input plane. Each holographic-optical element reflects only one wavelength of the output light. Dove prisms perform certain fixed interconnections. Beamsplitters reflect the light from the selected optical channel to an output-ring array.

9 Claims, 7 Drawing Sheets

OPTICAL INTERCONNECT FOR HIGH SPEED PROCESSOR

This patent stems from a continuation application of parent application Ser. No. 08/641,632, filed May 2, 1996, now U.S. Pat. No. 5,677,778 entitled OPTICAL INTERCONNECT FOR HIGH SPEED PROCESSORS, which was a continuation application of Ser. No. 08/068,518, filed May 28, 1993, entitled OPTICAL INTERCONNECT FOR HIGH SPEED LA OFFICES PROCESSORS, now U.S. Pat. No. 5,515,194 with issue date May 7, 1996. The benefit of the earlier filing date of the parent patent applications is claimed for common subject matter pursuant to 35 U.S.C. § 120.

BACKGROUND OF THE INVENTION

This invention relates to an optical free space interconnect for ultra-high speed single instruction multiple data processors.

DESCRIPTION OF THE RELEVANT ART

As the geometries of VLSI grow smaller and denser electronic interconnects and heat dissipation have been recognized as bottlenecks of advanced electronic computing systems. F. E. Kiamilev and et al., PERFORMANCE COMPARISON BETWEEN OPTOELECTRONIC AND VLSI MULTISTAGE INTERCONNECTION NETWORKS, J. Lightwave Tech., vol. 9, pp. 1674–1692, 1991. M. R. Feldman, S. C. Esener, C. C. Guest, and S. H. Lee, COMPARISON BETWEEN OPTICAL AND ELECTRIC INTERCONNECTS BASED ON POWER AND SPEED CONSIDERATIONS, Appl, Opt., vol. 27, pp. 1742–1751, 1988.

Furthermore, as systems are operated at higher and higher speeds, the latency induced by electronic connections becomes a limiting factor. Although some new techniques, such as three dimensional multi-chip modules, have been developed to provide short connection distances and less latency, the basic limitation of the pin-out problem in electronic connections cannot be fully removed. L. D. Hutchson and P. Haugen, OPTICAL INTERCONNECTS REPLACE HARDWIRE, IEEE Spectrum., pp. 30–35, 1987.

Optical interconnections, because of their three-dimensional (3-D) processing capabilities and matched impedance characteristic, have been considered as the best alternative to electronic interconnections. Optical implementations of chip-to-chip and backplane-to-backplane interconnections have been reported. See, e.g. J. W. Goodman, OPTICAL INTERCONNECTIONS FOR VLSI SYSTEMS, Proc. IEEE, vol. 72, p. 850, 1984. Optical 3-D multi-stage interconnection networks have been investigated and realized. A. A. Sawchuk Proc. SPIE, vol. 813, p. 547, 1987. Recently, a new free space optical interconnect based on ring topologies was proposed by Y. Li, B. Ha, T. W. Wang, A. Katz, X. J. Lu, and E. Kanterakis Appl, Opt., vol. 31, p. 5548, 1992.

Arranging the input array on a ring, this novel architecture is capable of interconnecting many processors with identical latency and minimal complexity, and cost. This architecture is best suitable for the implementation of Single Instruction Multiple Data (SIMD) stream machines. Most topologies developed for rectangular array, such as Nearest Neighbor (NN), Plus Minus 2I (PM2I), and Hypercube can be implemented using this ring is topology. A simplified architecture of the ring topology architecture is depicted in FIG. 1. The optical interconnect has an input ring array 42 and an output ring array 45. The optical interconnect uses a first plurality of beamsplitters 23, 24, 25, 26, connected to the input ring array 42. The first plurality of beamsplitters 23, 24, 25, 26 is connected through a plurality of optical switches 27, 28, 29, 30, a plurality of dove prisms 56, 57, 58, 59 to a second plurality of beamsplitters 61, 62, 63, 64. A multiple channel system is used to perform a certain interconnection, i.e. a set of permutations. The number of channels depends on the topology to be realized. For example, to realize the NN type of interconnect shown in FIG. 2, a four

SUMMARY OF THE INVENTION

A general object of the invention is an optical interconnect for connecting multiple data processors.

Another object of the invention is an optical interconnect having high speed.

According to the present invention, as embodied and broadly described herein, an optical interconnect is provided for use with a controller and a plurality of single-instruction-multiple-data (SIMD) processors. The input to the optical interconnect uses a modulator system which may include a plurality of laser diodes, a first plurality of optical switching devices, a fiber combiner, an optical fiber, a fiber splitter and a second plurality of optical-switching devices. Each of the plurality of laser diodes transmits light at a different wavelength. Each of the first plurality of optical-switching devices is connected, respectively, to a laser diode. The fiber combiner is connected to the first plurality of optical-switching devices. An optical fiber is connected to the fiber combiner for carrying the output light from the fiber combiner. The fiber splitter is connected to the optical fiber. The fiber splitter divides the output light into a plurality of equal length paths, with each path corresponding to each of the plurality of SIMD processors. The second plurality of optical-switching devices is connected to a plurality of outputs, respectively, of the fiber splitter, for modulating the output light.

At the input of the optical interconnect, a plurality of optical fibers are connected to the second Plurality of optical-switching devices, respectively. The plurality of optical fibers form an input ring at the input plane of the optical interconnect.

The optical interconnect includes a plurality of wavelength selective holographic-optical elements, a plurality of dove prisms, and a plurality of beamsplitters. The wavelength selecting holographic-optical elements is referred to hereinafter as a holographic-optical elements. The plurality of holographic-optical elements are coupled to the input ring. Each holographic-optical element reflects only one light wavelength and is transparent to other light wavelengths. A plurality of dove prisms is coupled to the plurality of holographic-optical elements. The first plurality of optical-switching devices select, at a given time, an optical channel. The input light propagates through the dove prism of the selected channel. Each dove prism performs a given, fixed, permutation, i.e., interconnection between processors, by rotating the image formed by the input ring array. The set of permutations obtained by all channels constitute the overall set of desired interconnections for the architecture to be realized. A plurality of beamsplitters is coupled to the plurality of dove prisms, respectively, for reflecting the selected optical channel to an output-ring detector array. The output-ring detector array is connected to the plurality of SIMD processors.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Figure 1:
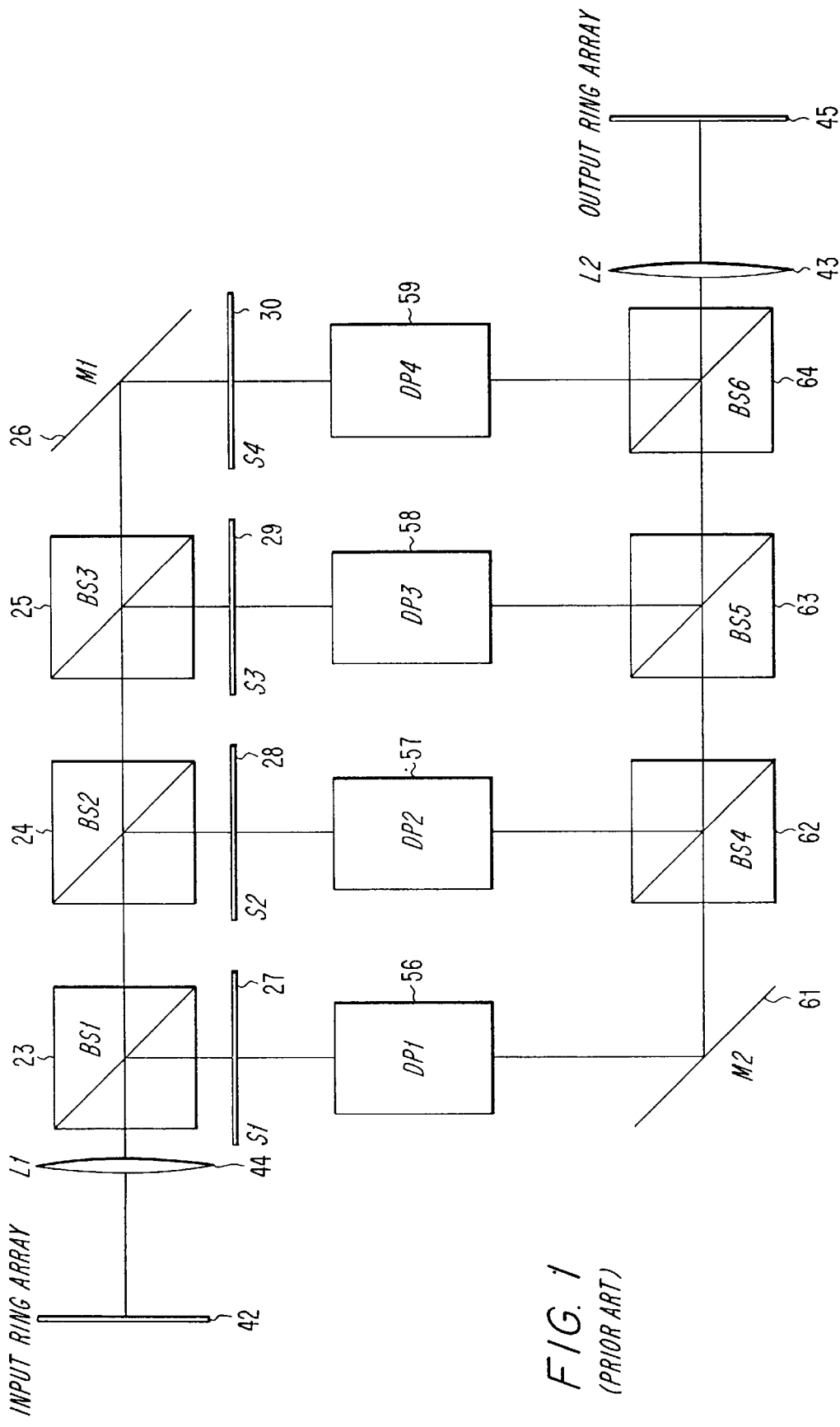
FIG. 1 shows general structure of the originally proposed optical ring topology NN interconnect architecture.
Figure 2:
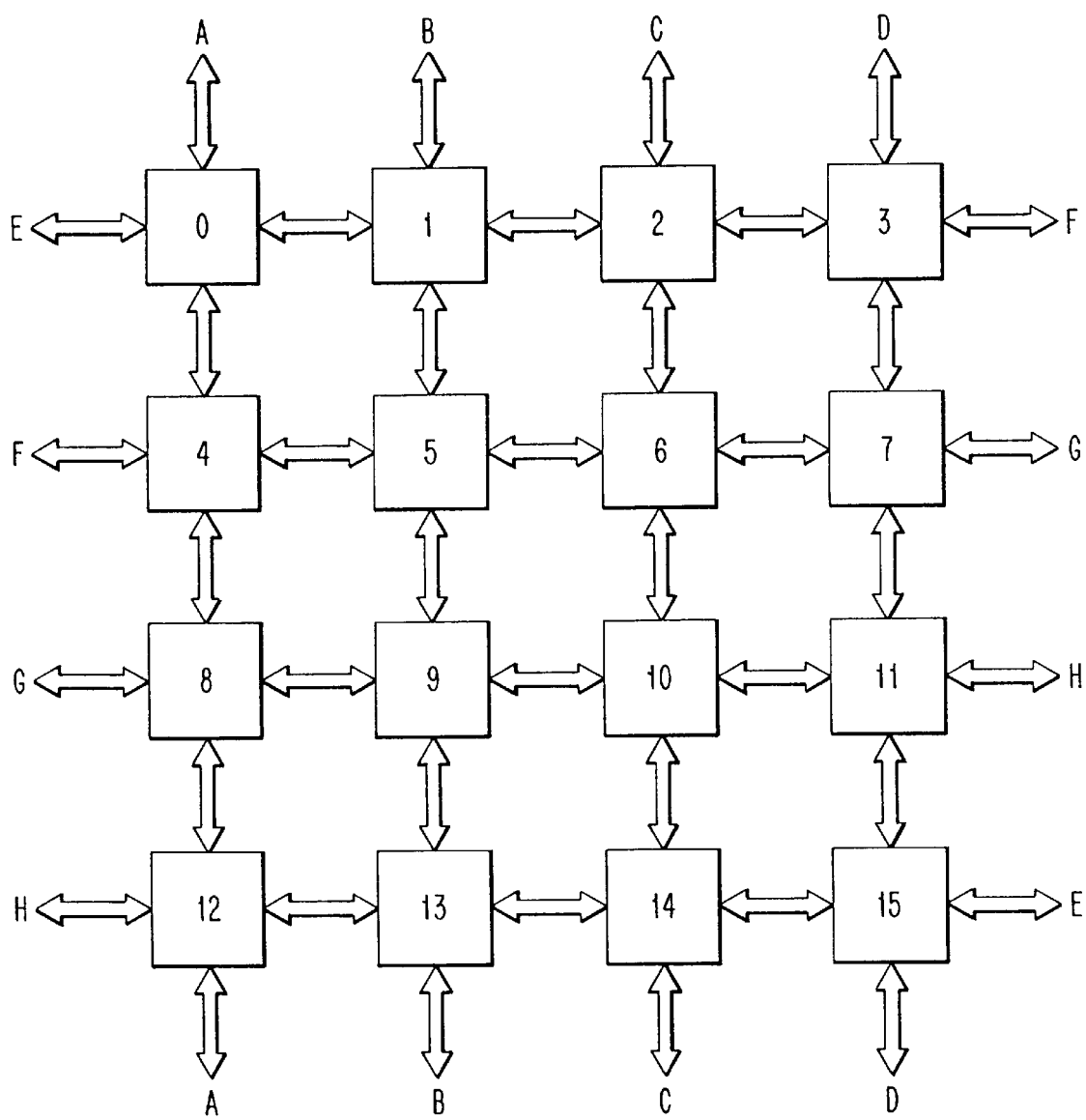
FIG. 2 shows grid array of an NN interconnect architecture.

Reference now is made in detail to the present preferred embodiments of the invention, examples of which are illustrated in the accompanying drawings, wherein like reference numerals indicate like elements throughout the several views.

The present invention provides a novel ring topology based architecture. The major features of this architecture are:

1. Instead of direct modulation of the laser diode current, external modulation may be used. Under this approach, integrated single element electro-optic switches capable of operating in excess of 40 GHz may be used.
2. Multiple wavelength laser diode sources combined with external switches are used to control the routing of light to different channels. This eliminates the need of two dimensional (2-D) array switching devices. The system performance may no longer be limited by these devices.
3. Wavelength selective holographic optical elements (holographic-optical elements) may be used to form the routing function of the system based on the selected light wavelength.

Broadly, the present invention uses a modulation system connected to an optical interconnect. The modulation system is external to the optical interconnect. The modulation system provides wavelength selection, and modulates the selected wavelength with data. Broadly, the modulation system includes second generating means, selecting means, combining means, dividing means, modulating means, and forming means. The selecting means is coupled to the first generating means and to the second generating means. The combining means is coupled to the selecting means. The dividing means is coupled to the combining is coupled to the selecting means. The dividing means is coupled to the combining means. The modulating means is coupled to the plurality of SIMD processors, and to the dividing means. The forming means is coupled to the modulating means.

The second generating means generates a plurality of coherent-light beams at a plurality of wavelengths. In response to a control signal from the first generating means, the first selecting means selects a single coherent-light beam at a single wavelength from the second generating means. The combining means combines output light from the selecting means. The dividing means divides the output light into a plurality of equal-length paths. Each equal-length path corresponds to each of the plurality of SIMD processors. Using data from the appropriate SIMD processors, the modulating means modulates the output light. The forming means forms an input ring at an input plane of the optical interconnect.

Figure 3:
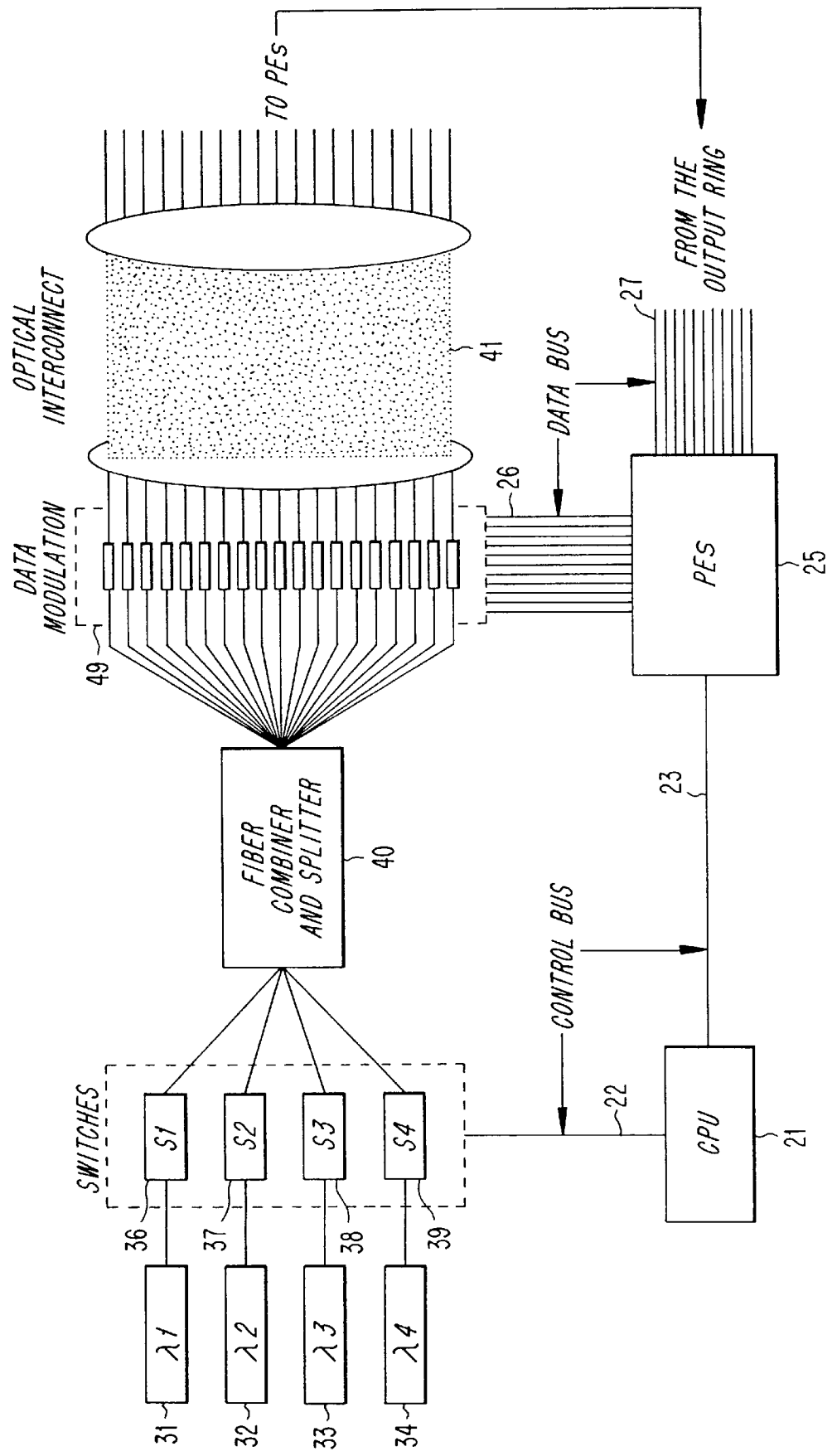
FIG. 3 shows a wavelength selection, external modulation system.

In the exemplary arrangement shown in FIG. 3, an optical interconnect for a plurality of single-instruction-multiple-data (SIMD) processors is provided using the first generating means. The first generating means is embodied as a controller 21 or equivalently a central processing unit (CPU). The CPU may employ a computer using, by way of example, 8086, 80286, 80386, 80486, or pentinum microprocessor, or equivalently a 68040 microprocessor, a larger computer system, or an application specific integrated circuit (ASIC) designed for the optical interconnect.

The second generating means is embodied as a plurality of laser diodes 31, 32, 33, 34, for generating a plurality of coherent light beams at a plurality of wavelengths, respectively. Each of the plurality of laser diodes 31, 32, 33, 34, operates at a different wavelength.

The selecting means is embodied as a first plurality of optical-switching devices 36, 37, 38, 39. The first plurality of optical-switching devices 36, 37, 38, 39 are coupled to a plurality of laser diodes 31, 32, 33, 34, respectively. The optical-switching devices control the on/off output of coherent-light beam from their respective laser diodes. Thus, a first optical switching device 36 controls whether or not the light from laser diode 31 is radiated. Similarly, second optical switching device 37 controls whether or not the light from laser diode 32 is radiated. Generally, the plurality of laser diodes 31, 32, 33, 34 radiate light continuously. The first plurality of optical-switching devices 36, 37, 38, 39 is coupled to the controller 21 through control bus 22. The controller 21 controls the operation of each of the first plurality of optical-switching devices 36, 37, 38, 39.

The combining means is embodied as a fiber combiner and splitter 40. The fiber combiner and splitter 40 is connected to the plurality of optical-switching devices 36, 37, 38, 39. The fiber combiner and splitter 40 combines output light from the first plurality of optical-switching devices 36, 37, 38, 39. An optical fiber, included in the fiber combiner and splitter 40, is connected between the fiber combiner and the fiber splitter for carrying the output light from the fiber combiner to the fiber splitter. The fiber splitter, which is connected at the output of the optical fiber, divides the output light into a plurality of equal-length paths. Each equal-length path corresponds to one of the plurality of SIMD processors 25. Thus, the output light from the optical-switching devices is fed to a single fiber with the use of a fiber combiner. The optical-switching devices are controlled by a controller 21 so that at each clock cycle, only one wavelength is selected. Therefore, only one light wavelength is present at the output of the fiber combiner. The fiber output is divided by a fiber splitter into a number of N equal length paths corresponding to the number of processors in the system. Each path serves one processor.

The modulating means is embodied as a second plurality of optical-switching devices 49. The second plurality of optical-switching devices 49 is coupled to the output of the fiber combiner and splitter 40, and to the plurality of SIMD processors 25 through data bus 26. The second plurality of optical-switching devices 49 modulates the output light from the fiber combiner and splitter 40.

Forming means may be embodied as a plurality of optical fibers. The plurality of optical fibers is connected to the second plurality of optical-switching devices 49. The plurality of optical fibers forms an input ring 42 at an input plane of the optical interconnect. Also shown on FIG. 3, is the output of the optical interconnect which is an output-ring array of optical detectors connected to the SIMD processors 25 through data bus 27. The plurality of SIMD processors 25 are controlled by controller 21 through control bus 23.

Thus, data modulation is performed by placing the second plurality of optical-switching devices 49 onto each output of the fiber splitter. The output fibers from the second plurality of optical-switching devices 49 are used to form the input ring at the input plane of the free space optical interconnect. The function of the optical system is to route the data through the proper channel according to the selected light wavelength. The output data from the interconnect system is then fed back to the Processing Elements (PEs), referred to herein as the SIMD processors, of the digital system.

Figure 4:
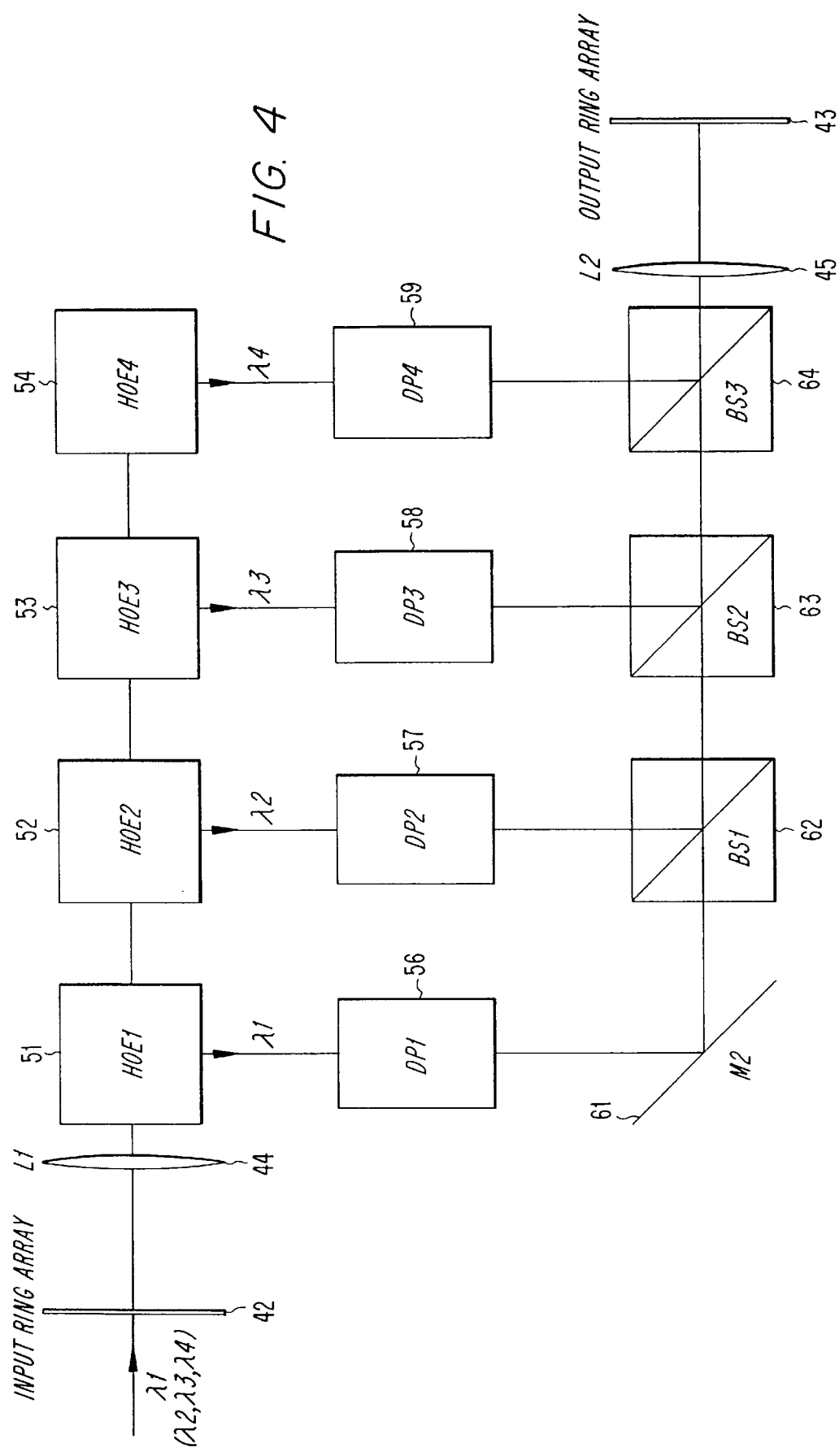
FIG. 4 shows the structure for an optical ring topology NN interconnect architecture.

As illustratively shown in FIG. 4, the structure for the optical ring topology interconnect architecture is depicted. The input system is connected to the input ring 42, and output detectors, such as photodiodes, form an output ring array 43. The optical interconnect includes first reflecting means, image-rotating means, and second reflecting means. The first reflecting means is depicted as a plurality of holographic-optical element reflectors 51, 52, 53, 54. The image-rotating means is depicted as a plurality of dove prisms 56, 57, 58, 59. The second reflecting means is shown as a plurality of beamsplitters 61, 62, 63, 64. The initial beam splitter 51 need only be a mirror. The plurality of dove prisms 56, 57, 58, 53 are connected between the plurality or holographic-optical elements 51, 52, 53, 54 and the plurality of beamsplitters 61, 62, 63, 64, respectively. Accordingly, a first dove prism 56 is connected between a first holographic element 51 and either a first beam splitter 61 or equivalently a mirror. The second dove prism 57 is connected between a second holographic-optical element 52 and the second beam splitter 62. The third dove prism 58 is connected between the third holographic-optical element 53 and the third beam splitter 63. Each holographic-optical element reflects light at one wavelength and is transparent to light at other wavelengths. Light passing through each of the dove prisms is at a wavelength according to the holographic-optical element corresponding to that dove prism. The beamsplitters 61, 62, 63, 64 reflect light at all wavelengths passing through the dove prisms and their respective holographic-optical elements.

The plurality of dove prisms 56, 57, 58, 59 are fixed at a specific orientation, i.e. rotation, with respect to the input ring. Accordingly, a dove prism performs a selected interconnection between SIMD processors according to the orientation of the dove prism, rotation about the optical axis of the dove prism, i.e., with respect to the input ring. The output optical ring is connected to the plurality of SIMD processors 25.

In use, the plurality of laser diodes 31, 32, 33, 34 generate a plurality of coherent-light beams at a plurality of wavelengths. Each of the coherent-light beams is at a different wavelength from the other coherent-light beams of the plurality of coherent-light beams. The first plurality of optical-switching devices 36, 37, 38, 39 are controlled by a control signal from the controller 21. The control signal determines which of the optical-switching devices allows light to pass from the plurality of laser diodes 31, 32, 33, 34. Accordingly, by the appropriate control signal, the first plurality of optical-switching devices selects a single coherent-light beam from the plurality of coherent-light beams, at a single wavelength. The fiber combiner and splitter 40 combines output light from the first plurality of optical-switching devices 36, 37, 38, 39, and divides the output light into a plurality of equal-length paths. Each of the equal-length path corresponds to each of the plurality of SIMD processors.

Data from the SIMD processors, at a given moment in time, modulates the output lights from the fiber combiner and splitter 40. The controller 21 controls which of the SIMD processors 25 modulates the output light. The plurality of optical fibers forms an input ring at the input plane of the optical interconnect, so that output light at any wavelength has the same path in length into the optical interconnect.

Figure 5:
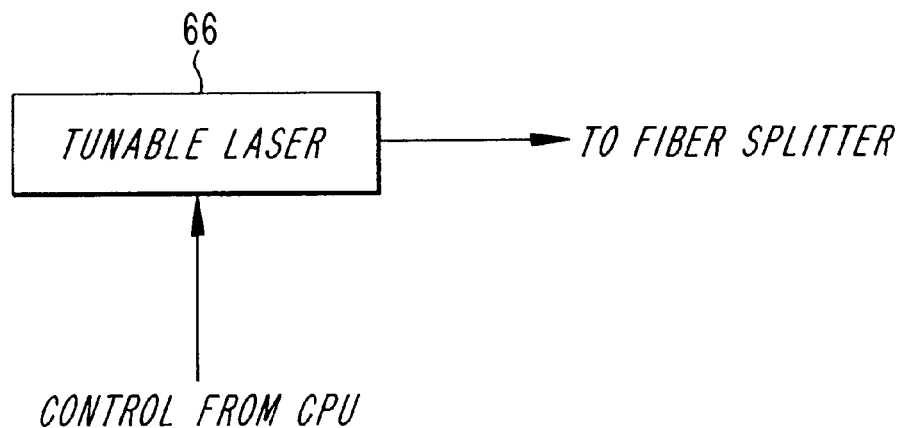
FIG. 5 shows electronically controlled tunable laser.

In the optical interconnect, each of the plurality of holographic-optical elements 51, 52, 53, 54 reflects light at a single wavelength and is transparent to light at other wavelengths. Therefore, only one optical channel is operational for each wavelength. Selected permutations are accomplished by controlling the optical-switching devices 36, 37, 38, 39. Clearly only one of them is on at a time. Absorption and diffraction efficiency of the holographic-optical elements are the two factors which nay induce power loss in the free space optical interconnect system. Absorption in the infrared region is very low for photopolymer holographic materials. A diffraction efficiency of more than 99% has been obtained for a reflection type hologram. Therefore, the free space optical system may attain nearly 100% light efficiency. The power loss due to having all lasers operating at all times may be alleviated by using a single tunable laser diode 66, see FIG. 5. However, this puts restrictions on the switching speed between wavelengths and the selectivity of the holographic-optical elements.

The plurality of dove prisms 56, 57, 58, 59 each perform at a given time, a selected fixed interconnection between SIMD processors according to the orientation of the dove prism, rotation about the optical axis of the dove prism, i.e., with respect to the input ring. The optical channel is determined by the control signal from the controller 21 which controls the first plurality optical-switching devices 36, 37, 38, 39. The plurality of beamsplitters 61, 62, 63, 64 are coupled to the plurality of dove prisms 56, 57, 58, 59 and reflect the light from the selected optical channel to the output-ring detector array 43. The output ring detector array 43 detects the output light from the selected optical channel and the data are fed on the data bus 27 to the SIMD processors 25.

The channel selecting means alternatively may be embodied as internal modulators to the lasers. The light admitted by the lasers thus is modulated by altering the electric current which drives each laser. While FIG. 3 shows external light modulation, internal modulation may also be used depending on the processor speed and may be sufficient.

Figure 7:
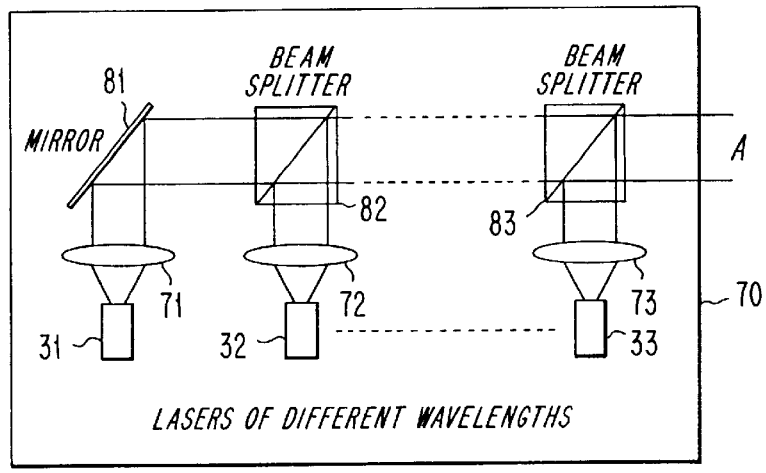
FIG. 7 shows a free space power combiner.

FIG. 7 illustratively shows the light admitted by all lasers may be combined and then split approximately at equal powers to a set of components the number of which equals the number of processing elements. There are many alternatives in performing this function. FIG. 3 illustrates an efficient method when a small number of processors are involved. For a large number of processors, other more efficient methods as the one illustrated in FIGS. 7 and 8 may be employed.

FIG. 8 shows an alternative free space power splitting system which includes phase grating 86 and optical system 87. A cross section at focal plane 88 is shown as a grid array of line spectra.

Figure 9:
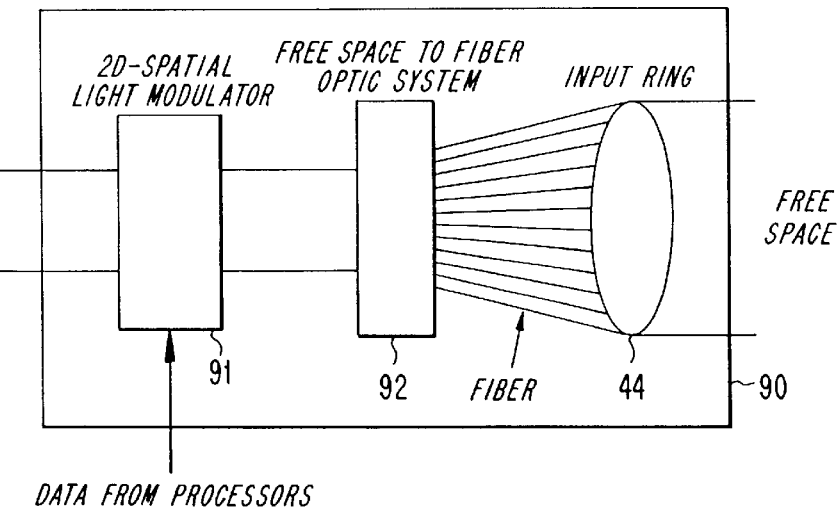
FIG. 9 illustrates data modulation and coupling to input ring.

FIG. 9 shows the data modulation and coupling to the input ring 44 which may employ a 2-D spatial light modulator 91 coupled to the data from the processing elements 25. Free space to fiber optical system 92 is coupled to the 2-D spatial light modulator and the input ring 44.

Figure 6:
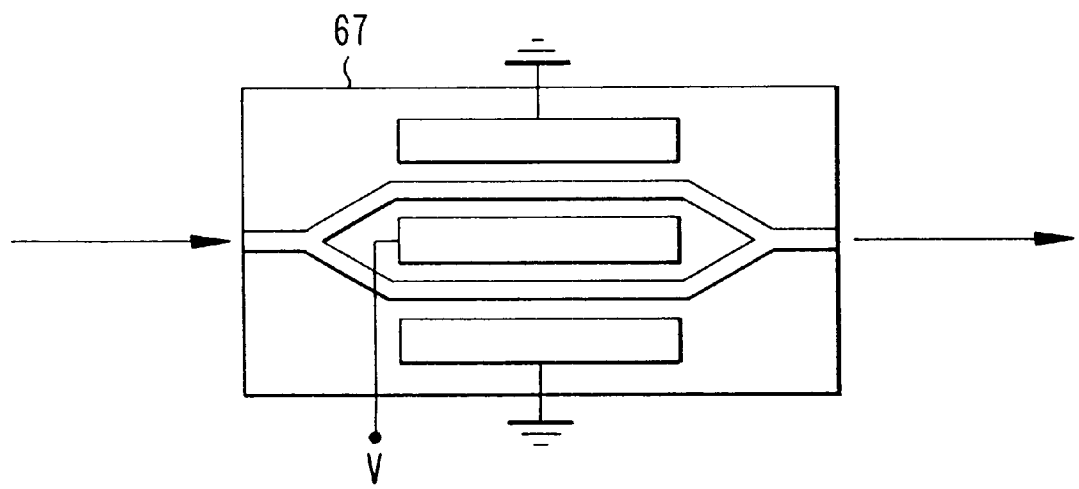
FIG. 6 shows general architecture of an interferometric Mach-Zehnder switch.

A complex component in the system is the one containing the data modulators, i.e. the optical-switching devices. Although different switching devices may be used, waveguide switching devices are well suitable for this purpose. Waveguide switches have been investigated and used in optical integrated circuits for almost twenty years. See L. Thylen IEEE J. Lightwave Technol., vol. 6, p. 847, 1988. The most common type of waveguide switches is the interferometric Mach-Zehnder (M-Z) switch shown in FIG. 6. Light is coupled into a single-node fiber, and then split evenly into two paths forming a Y junction.

The light from the two paths is then combined into a single mode waveguide 67. Depending on the relative phase delay between the two optical paths, the recombined light output can be switched from a maximum to a minimum power. This phase delay can be controlled by an electronically applied voltage. M-Z devices can operate at any wavelength at which the waveguide is transparent, and thus are appropriate for use in the system architecture. M-Z devices can be also be used as a data modulator. The maximum data rates at which the system can operate is not limited by the bandwidth of M-Z devices. Currently, $LiNbO_3$ based semiconductor waveguide M-Z switches have been operated at 40 GHz while maintaining greater than 20-dB on/off extinction ratio. Electro-optic polymers may also be candidates for fast speed switching devices because of their compatibility with optoelectronic integration.

The holographic-optical elements are key components in this interconnect system. The requirements of the holographic-optical elements are high diffraction efficiency, high spectral selectivity, and low absorption. The holographic-optical elements shown in FIG. 4 are reflection type holograms, though both reflection and transmission type holograms may be used.

Because of their higher wavelength selectivity, reflection holograms are desirable. To estimate the wavelength selectivity of a reflection hologram, a brief analysis is given. According to Kogelnik H. Kogelnik, "Coupled wave theory for thick hologram gratings," Bell Syst. Tech. J., vol 48, pp. 2909–2947, 1969, the amplitude of the diffracted wave for an unslanted reflection grating is expressed by $$S = \frac{-i}{\left(\frac{i}{\xi_r}\gamma_r + [1-(\xi_r\gamma_r)^{1/2}]^{1/2}\coth(\gamma_r^2-\xi_r^2)^{1/2}\right)}, \quad (1)$$

where $$\upsilon_r = \pi n_1 \frac{T}{\lambda \sin\theta}, \quad (2)$$

$$\xi = \delta\beta T\cos\theta = \frac{2\pi}{\lambda}n_0\delta T\cos\theta, \quad (3)$$

$\delta$ is the deviation of the incident angle away from the Bragg angle $\theta_0$ given by $\delta=\theta-\theta_0$. T is the thickness of the recording material, $\lambda$ is the illumination wavelength, $n_1$ is the index modulation, $n_0$ is the index of refraction of the material, and $\theta$ is the incident angle. The Bragg condition is expressed by $$2\,d\,n_0\sin\theta_0=\lambda_0, \quad (4)$$

where d is the grating spacing and $\lambda_0$ is the wavelength satisfying the Bragg condition. Under Bragg condition, maximum diffraction efficiency is obtained. Letting the wavelength of the illumination be changed to $\lambda_0+\delta\lambda_0$, the maximum diffraction efficiency is no longer obtained at the illumination angle $\theta_0$, but instead is given by the new Bragg angle $\theta'_0=\theta_0+\delta\theta$. If we maintain the illumination at the original angle $\theta_0=\theta'_0-\delta\theta$, diffraction efficiency is reduced according the deviation $\delta\theta$ from the Bragg angle $\theta'_0$. The spectral selectivity is defined as the width $\delta\lambda$ until the diffraction efficiency goes to zero. The Bragg condition given in Equation 4 may be expressed in terms of $\delta\lambda$ as $$2\,d\,n_0\sin(\theta_0+\delta\theta)=\lambda_0=\delta\lambda, \quad (5)$$

Making some approximations and using Equation 4, yields $$\delta\theta_0 = -\frac{\delta\lambda}{\lambda}\tan\theta_0. \quad (6)$$

Figure 10:
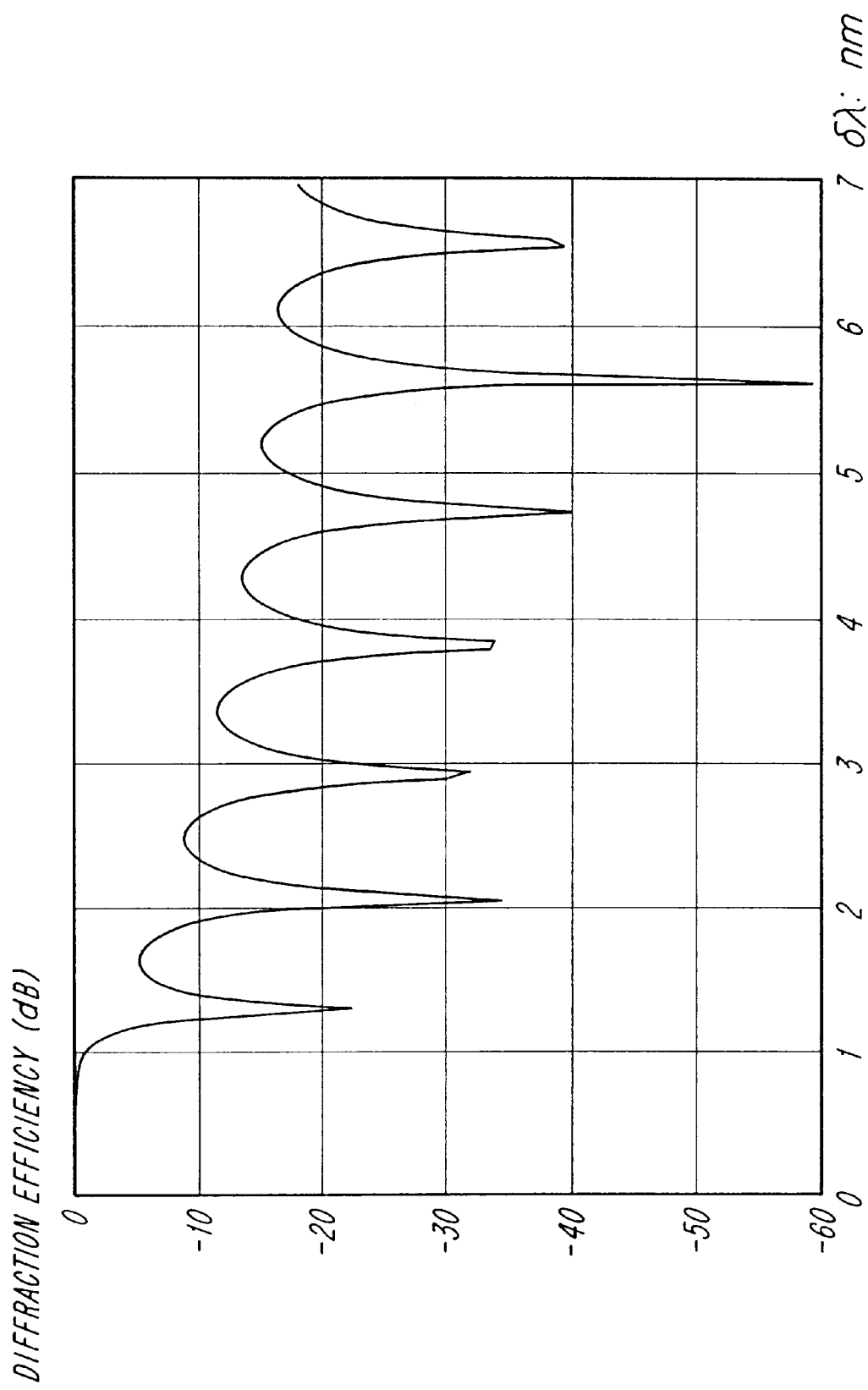
FIG. 10 shows spectral selectivity of a reflection holographic grating.

Substituting the above equations into Equation 1, the formula for the diffraction efficiency is obtained. FIG. 10 illustrates the diffraction efficiency dB vs. $\delta\lambda$. The parameters used were $\lambda=1.3$ $\mu$m. T=500 $\mu$m, n=1.52, $\theta=\pi/4$, and $\upsilon=0.957$. The curve shows that for these parameters, the spectral selectivity is equal to 1.2 nm. When holographic-optical elements are used, crosstalk is induced by light from the zeroth order. In the above case, the crosstalk is less than −20 dB, which is equivalent to a contrast ratio of 100:1 in an intensity switching configuration. Evidently, the high wavelength selectivity and the low crosstalk will allow us to employ a large number of channels. This architecture, while maintaining all the advantages of cast ring topologies, overcomes current switching device problems such as slow speed and lack of appropriate 2-D array devices. Employing waveguide switches, the system is capable to operate at data rates up to 40 GHz. The use of holographic-optical elements makes possible to self-route the wavelength coded input data. With the development of waveguide switches, the proposed architecture leads to a very powerful interconnect system for the implementation of SIMD machines.

To ensure the full functionality of the ring topology based optical free space interconnect system, device issues should be addressed. Two basic devices are needed in the implementation of this architecture: optical transmitters/receivers and optical switching devices. Theoretically, since the system has identical latency, the interconnect system does not impose any limitation on the system data rate(s)

The present invention also includes a method for optically interconnecting a plurality of SIMD processors. The method includes the steps of generating a control signal from a processor, and generating a plurality of coherent-light beams at a plurality of wavelengths, respectively. In response to the control signal, the method selects a first coherent-light beam at a first wavelength from a plurality of wavelengths, and combines and divides the output light for each of the plurality of wavelengths into a plurality of equal-length paths. Each of the equal-length paths corresponds to each of the SIMD processors. Using data from a respective SIMD processor, the method modulates, corresponding to the light with selected wavelength, the output light, and forms with the output light at a respective wavelength, and input ring at the optical interconnect.

The method includes using the optical interconnect for reflecting from the input plane the output light, and in response to the control signal, selecting an optical channel for the reflected output light. The light from the selected optical channel is reflected to an output-ring detector array, and is thereby detected by the detectors. The detected signal is fed back to the SIMD processors.

The method performs the above steps for each wavelength, and then repeats the entire sequence for all wavelengths.

It will be apparent to those skilled in the art that various modifications can be made to the optical interconnect for high speed processors of the instant invention without departing from the scope or spirit of the invention, and it is intended that the present invention cover modifications and variations of the optical interconnect for high speed processors provided they come within the scope of the appended claims and their equivalents.

We claim:

1. A method for optically interconnecting a plurality of single-instruction-multiple-data (SIMD) processors, comprising the steps of:

generating a control signal;

generating a plurality of coherent-light beams at a plurality of wavelengths, respectively;

selecting, responsive to the control signal, a first wavelength from the plurality of wavelengths as an output light;

combining the output light;

dividing the combined output light into a plurality of equal-length paths, each path corresponding to one of said plurality of SIMD processors;

modulating the output light with data from a selected SIMD processor;

forming an input ring at an input plane of an optical interconnect;

activating, responsive to the first wavelength as the output light, a first optical channel;

reflecting the first wavelength from the input plane;

rotating an image formed at the input plane; and reflecting the rotated image to an output-ring array.

2. The method as set forth in claim 1, further comprising the steps of:

selecting, responsive to the control signal, a second wavelength from the plurality of wavelengths as the output light;

combining the output light;

dividing the combined output light into a plurality of equal-length paths, each path corresponding to one of said plurality of SIMD processors;

modulating the output light with data from a selected SIMD processor;

activating, responsive to the second wavelength as the output light, a second optical channel;

reflecting the second wavelength from the input plane;

rotating an image formed at the input plane; and reflecting the rotated image to the output-ring array.

3. A method for optically interconnecting a plurality of single-instruction-multiple-data (SIMD) processors, comprising the steps of:

generating a control signal;

generating a plurality of coherent-light beams at a plurality of wavelengths, respectively;

selecting, responsive to the control signal, a first wavelength from the plurality of wavelengths as an output light;

modulating the output light with data from a selected SIMD processor;

activating, responsive to the first wavelength as the output light, a first optical channel;

reflecting the first wavelength from an input plane;

rotating an image formed at the input plane; and reflecting the rotated image to an output-ring array.

4. The method as set forth in claim 1, further comprising the steps of:

selecting, responsive to the control signal, a second wavelength from the plurality of wavelengths as the output light;

modulating the output light with data from a selected SIMD processor;

activating, responsive to the second wavelength as the output light, a second optical channel;

reflecting the second wavelength from the input plane;

rotating an image formed at the input plane; and reflecting the rotated image to the output-ring array.

5. A method for optically interconnecting a plurality of single-instruction-multiple-data (SIMD) processors, comprising the steps of:

generating a control signal;

generating a plurality of coherent-light beams at a plurality of wavelengths using a plurality of laser diodes;

generating light at a first wavelength;

controlling radiation of light from said plurality of laser diodes using a plurality of optical switching devices such that only one wavelength is selected for a given clock cycle;

selecting, responsive to the control signal, the first wavelength as an output light;

modulating the output light with data from a selected SIMD processor;

reflecting light at a particular wavelength and passing light at other wavelengths using a plurality of holographic-optical elements, respectively;

interconnecting the plurality of SIMD processors using a plurality of dove prisms;

reflecting, with a first holographic-optical element, the first wavelength;

passing the first wavelength according to a rotation, with respect to an input ring, of a first dove prism;

reflecting light passing through said plurality of dove prisms using a plurality of beamsplitters; and reflecting, using a first beamsplitter, the first wavelength to an output-ring array.

6. The method as set forth in claim 5, further comprising the steps of:

generating light at a second wavelength;

selecting, responsive to the control signal, a second wavelength as the output light;

reflecting, with a second holographic-optical element, the second wavelength;

passing the second wavelength according to a rotation, with respect to the input ring, of a second dove prism; and reflecting, using a second beamsplitter, the second wavelength to said output-ring array.

7. A method for optically interconnecting a plurality of single-instruction-multiple-data (SIMD) processors, comprising:

generating a control signal;

generating a plurality of coherent-light beams at a plurality of wavelengths, respectively;

selecting, responsive to the control signal, a single wavelength from the plurality of wavelengths as an output light;

modulating the output light with data from a selected SIMD processor;

forming an input ring at an input plane of an optical interconnect;

selecting a first wavelength;

reflecting light at the first wavelength and passing light at other wavelengths;

rotating, responsive to the first wavelength, an image formed at said input plane; and reflecting the rotated image to an output-ring array.

8. The method as set forth in claim 7 further comprising the steps of:

selecting a second wavelength;

reflecting light at the second wavelength and passing light at other wavelengths;

rotating, responsive to the second wavelength, an image formed at said input plane; and reflecting the rotated image to the output-ring array.

9. The method as set forth in claim 7 further comprising, after the step of selecting a single wavelength, the steps of:

combining the output light; and dividing the combined output light into a plurality of equal-length paths, with each equal-length path corresponding to one of said plurality of SIMD processors.

* * * * *

UNITED STATES PATENT AND TRADEMARK OFFICE
CERTIFICATE OF CORRECTION

PATENT NO : 6,008,918
DATED : December 28, 1999
INVENTOR(S) : Kanterakis et al.

It is certified that error appears in the above-identified patent and that said Letters Patent is hereby corrected as shown below:

At column 1, line 65, after "ring" insert therefor --is--.

At column 2, line 10, after "a four" insert therefor --channel system is needed--.

At column 2, line 40, delete "Plurality" and insert therefor --plurality--.

Figure 8A:
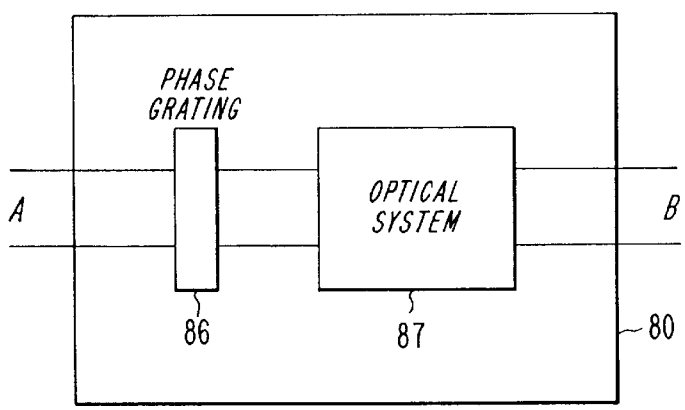
FIG. 8 shows a free space power splitter.
Figure 8B:
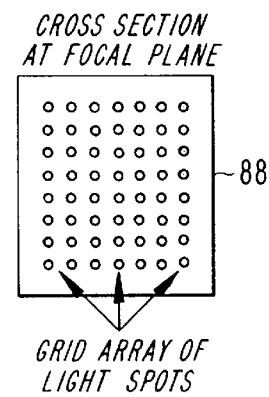

At column 3, line 26, delete "FIG. 8 shows a free space power splitter;" and insert therefor --FIG. 8a shows an alternate free space power splitter;

FIG. 8b shows a cross section at focal plane;--.

At column 5, line 38, delete "51" and insert therefor --61--.

At column 5, line 39, delete "53" and insert therefor --59--.

At column 5, line 39, delete "or" and insert therefor --of--.

At column 6, line 31, delete "nay" and insert therefor --may--.

At column 7, line 4, delete"FIG. 8" and insert therefor --FIG. 8a--.

At column 7, line 6, after "is shown" insert therefor --is shown in FIG. 8b--.

At column 8, line 18, after "$\lambda_0$" delete "=" and insert therefor --+--.

At column 8, line 29, delete "0.957" and insert therefor --0.95$\pi$--.

At column 8, line 37, delete "cast" and insert therefor --past--.

At column 8, line 52, after "rate(s)" insert therefor --.--.

UNITED STATES PATENT AND TRADEMARK OFFICE
CERTIFICATE OF CORRECTION

PATENT NO. : 6,008,918
DATED : December 28, 1999
INVENTOR(S) : Kanterakis et al.

It is certified that error appears in the above-identified patent and that said Letters Patent is hereby corrected as shown below:

At column 8, line 52, after "rate(s)" insert therefor --.--.

Signed and Sealed this

Twenty-first Day of November, 2000

Attest:

Q. TODD DICKINSON

*Attesting Officer*  *Director of Patents and Trademarks*